United States Patent
Kuo (10) Patent No.: US 11,710,806 B2
(45) Date of Patent: Jul. 25, 2023

(54) LIGHT-EMITTING UNIT

(71) Applicant: InnoLux Corporation, Miao-Li County (TW)

(72) Inventor: Shu-Ming Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 190 days.

(21) Appl. No.: 17/105,732

(22) Filed: Nov. 27, 2020

(65) Prior Publication Data

US 2022/0069171 A1    Mar. 3, 2022

(30) Foreign Application Priority Data

Aug. 28, 2020   (CN) .......................... 202010885998.3

(51) Int. Cl.
| | |
|---|---|
| H01L 33/50 | (2010.01) |
| H01L 25/075 | (2006.01) |
| H01L 33/58 | (2010.01) |
| H01L 33/60 | (2010.01) |

(52) U.S. Cl.
CPC .......... *H01L 33/50* (2013.01); *H01L 25/0753* (2013.01); *H01L 33/58* (2013.01); *H01L 33/60* (2013.01)

(58) Field of Classification Search
CPC ................. H01L 33/50; H01L 33/60
See application file for complete search history.

(56) References Cited

U.S. PATENT DOCUMENTS

| | | | |
|---|---|---|---|
| 10,361,248 B2 | 7/2019 | Lee et al. | |
| 10,763,399 B2 | 9/2020 | Lee et al. | |
| 10,804,441 B2 | 10/2020 | Wang et al. | |
| 2011/0284884 A1* | 11/2011 | Lee | H05B 45/42 257/98 |
| 2012/0129878 A1* | 5/2012 | Murakawa | A61P 3/08 514/274 |
| 2014/0339495 A1* | 11/2014 | Bibl | H01L 33/502 257/13 |
| 2014/0362885 A1 | 12/2014 | Sakuta et al. | |
| 2016/0218256 A1* | 7/2016 | Taki | H01L 33/505 |

(Continued)

FOREIGN PATENT DOCUMENTS

| | | |
|---|---|---|
| CN | 107086226 A | 8/2017 |
| CN | 108242483 A | 7/2018 |

(Continued)

OTHER PUBLICATIONS

Chinese language office action dated Sep. 14, 2021, issued in application No. TW 110101258.

(Continued)

*Primary Examiner* — Jay C Chang
*Assistant Examiner* — Mikka Liu
(74) *Attorney, Agent, or Firm* — McClure, Qualey & Rodack, LLP (57) ABSTRACT

A light-emitting unit is provided. The light-emitting unit includes a light-emitting element, a light conversion layer, and a color filter layer. The light conversion layer is disposed on the light-emitting element. The color filter layer covers the sidewalls of the light conversion layer. In addition, the light-emitting unit further includes a protection layer located between the color filter layer and the light conversion layer.

18 Claims, 11 Drawing Sheets

(56) References Cited

U.S. PATENT DOCUMENTS

| | | | |
|---|---|---|---|
| 2017/0331003 A1* | 11/2017 | Cheng | H01L 33/507 |
| 2018/0151543 A1 | 5/2018 | Lee | |
| 2018/0321558 A1 | 11/2018 | Hu et al. | |
| 2019/0019786 A1 | 1/2019 | Kim et al. | |
| 2020/0013931 A1 | 1/2020 | Hong et al. | |

FOREIGN PATENT DOCUMENTS

| | | |
|---|---|---|
| TW | 202018997 A | 5/2020 |
| WO | 2014075737 A1 | 5/2014 |

OTHER PUBLICATIONS

EP Extended Search Report dated Jun. 23, 2021 for the corresponding application No. 21151240.5.

* cited by examiner

LIGHT-EMITTING UNIT

CROSS REFERENCE TO RELATED APPLICATIONS

This application claims priority of China Patent Application No. 202010885998.3 filed on Aug. 28, 2020, the entirety of which is incorporated by reference herein.

BACKGROUND

Field of the Disclosure

The present disclosure relates to a light-emitting unit, and in particular to a light-emitting unit with a color filter layer covering sidewalls of a light conversion layer.

Description of the Related Art

Light-emitting diodes (LEDs) are commonly used in various electronic devices (such as display devices). In existing light-emitting units, the combination of the light-emitting diodes with the light conversion structure and/or the light filter structure may cause light leakage on the side of the light-emitting diodes, reduce the color purity of the light emitted by the light-emitting unit, and affect the display quality. Therefore, how to solve the above problem has become an important issue.

BRIEF SUMMARY

Some embodiments of the disclosure provide a light-emitting unit, including: a light-emitting element, a light conversion layer and a color filter layer. The light conversion layer is disposed on the light-emitting element. The color filter layer covers the sidewalls of the light conversion layer.

Some embodiments of the disclosure provide a light-emitting module, including a plurality of light-emitting units. Each of the plurality of light-emitting units includes a light-emitting element, a light conversion layer, a color filter layer and a reflective layer. The light conversion layer is disposed on the light-emitting element. The color filter layer covers a sidewall of the light conversion layer. The reflective layer is disposed on a sidewall of the light-emitting element. The reflective layers of adjacent two of the plurality of light-emitting units connect to each other.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The present disclosure may be understood referring to the following description and the appended drawings. It is noted that for the sake of the comprehensibility and the simplicity of the drawings for the readers, only a portion of the light-emitting unit is illustrated in multiple figures in the present disclosure, and the specific component in the figures are not drawn to scale. In addition, the number and size of each component in the drawings merely serve as an example, but are not intended to limit the scope of the present disclosure. Furthermore, similar and/or corresponding numerals may be used in different embodiments for describing some embodiments simply and clearly, but not represent any relationship between different embodiment and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open words, so they should be interpreted as meaning "including but not limited to . . . ". Therefore, when terms "including", "comprising", and/or "having" are used in the description of the disclosure, the presence of corresponding features, regions, steps, operations and/or components is specified without excluding the presence of one or more other features, regions, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (such as a film layer or region) is referred to as "on another component", it may be directly on another component, or there may be other components in between. On the other hand, when a component is referred "directly on another component", there is no component referred between the former two. In addition, when a component is referred "on another component", the two components have an up-down relationship in the top view, and this component can be above or below the other component, and this up-down relationship depends on the orientation of the device.

The terms "about" or "substantially" are generally interpreted as within 20% of a given value or range, or as interpreted as within 10%, 5%, 3%, 2%, 1%, or 0.5% of a given value or range.

It should be understood that, although the terms "first", "second" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to the second value, it implies that an error of about 10% between the first value and the second value may be present. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
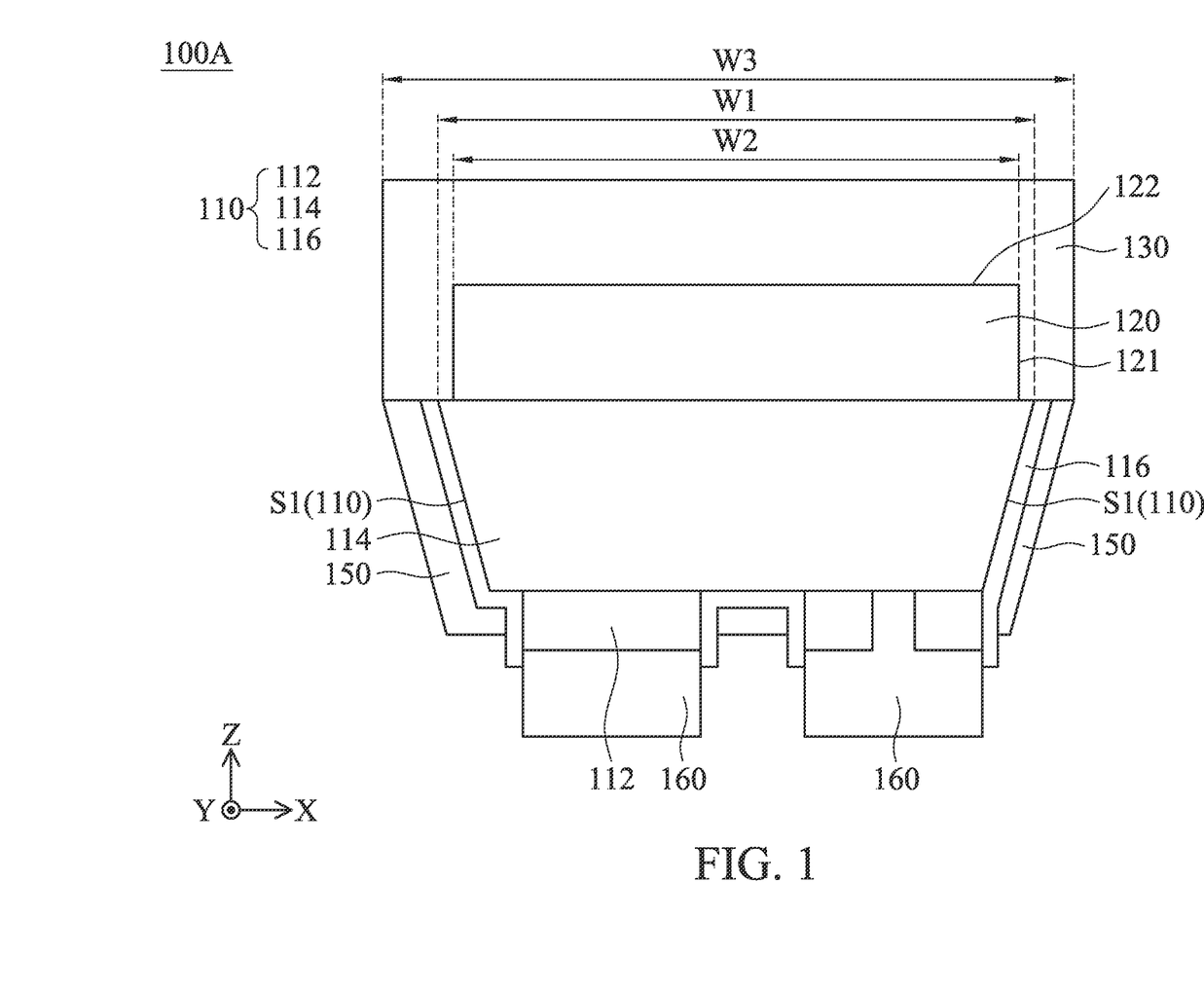
FIG. 1 is a cross-sectional view illustrating a light-emitting unit in accordance with some embodiments of the present disclosure.

FIG. 1 is a cross-sectional view illustrating a light-emitting unit 100A in accordance with some embodiments of the present disclosure. As shown in FIG. 1, the light-emitting unit 100A includes a light-emitting element 110, a light conversion layer 120, and a color filter layer 130. The light conversion layer 120 is disposed on the light-emitting element 110, and the color filter layer 130 covers a sidewall 121 of the light conversion layer 120. The light-emitting element 110 may include a mini LED, a micro LED, quantum dot (QD) light-emitting diode (such as including QLED, QDLED), fluorescence, phosphor, or any other suitable material. These materials may be arranged and combined arbitrarily, but the present disclosure is not limited thereto. In other embodiments, the light-emitting element 110 may include an organic light-emitting diode (OLED). In the present embodiment, the light-emitting element 110 may include a semiconductor layer 112, a semiconductor layer 114, and an insulating layer 116, but is not limited thereto. In the present embodiment, the semiconductor layer 112 and/or the semiconductor layer 114 may include gallium nitride (GaN) and other suitable materials, but it is not limited thereto. In some embodiments, the semiconductor layer 112 and the semiconductor layer 114 may include different types of semiconductor materials. For example, the semiconductor layer 112 may include a p-type semiconductor layer, and the semiconductor layer 114 may include an n-type semiconductor layer, but the present disclosure is not limited thereto. In other embodiments, the semiconductor layer 112 may include an n-type semiconductor layer, and the semiconductor layer 114 may include a p-type semiconductor layer. In some embodiments, the light-emitting element 110 may emit blue light, but it is not limited thereto. In other embodiments, the light-emitting element 110 may emit UV light or light of other suitable wavelengths. In some embodiments, the insulating layer 116 may be disposed or formed on the sidewalls of the semiconductor layer 112 and/or the semiconductor layer 114 to reduce the probability of the semiconductor layer 112 and/or the semiconductor layer 114 being damaged or being invaded by water and oxygen, which affects the performance. However, the present disclosure is not limited thereto. The insulating layer 116 may electrically insulate the light-emitting element 110 from other conductive layers (for example, a reflective layer 150 mentioned below), and reduce the probability of forming short circuit between the other conductive layers (for example, the reflective layer 150) and the light-emitting element 110, and affecting the performance of the light-emitting element 110.

In some embodiments, a light conversion layer 120 may be disposed on the light-emitting element 110 to convert the light (for example, blue light or UV light) emitted by the light-emitting element 110 into green light, red light or any other shade. For example, the material of the light conversion layer 120 may include quantum dots (QD), fluorescent materials, any other light conversion materials or a combination thereof. It should be understood that, in some embodiments, the light conversion layer 120 may be replaced with other transparent materials (such as transparent insulating materials), but is not limited thereto. In addition, a color filter layer 130 may be selectively disposed on the light conversion layer 120. The color filter layer 130 may be used to filter a portion of the color light that has not been converted by the light conversion layer 120, or reduce the probability of the unconverted color light being emitted in order to improve the color purity of the light emitted by the light-emitting unit. In some embodiments, the color filter layer 130 may cover the sidewall 121 of the light conversion layer 120. For example, the color filter layer 130 may cover the upper surface 122 and/or the sidewall 121 of the light conversion layer 120, and the sidewall 121 is connected to the upper surface 122. When the color filter layer 130 covers the sidewall 121 of the light conversion layer 120, the unconverted color light emitted from the sidewall 121 of the light conversion layer 120 and observed by the user may be reduced to improve the color purity of the light. The display quality of the light-emitting unit 100A may be improved.

In some embodiments, the light conversion layer 120 contacts the light-emitting element 110, but it is not limited thereto. In some embodiments, the color filter layer 130 contacts the light conversion layer 120, but it is not limited thereto. In some embodiments, the light conversion layer 120 is disposed between the color filter layer 130 and the light-emitting element 110. In some embodiments, the width W1 of the light-emitting element 110 may be greater than the width W2 of the light conversion layer 120, but it is not limited thereto. In other words, in the top-view direction Z, a portion of the light-emitting element 110 may overlap the light conversion layer 120, and another portion of the light-emitting element 110 may not overlap the light conversion layer 120. In some embodiments, the width W3 of the color filter layer 130 may be greater than the width W2 of the light conversion layer 120 and/or the width W1 of the light-emitting element 110, but is not limited thereto. In other embodiments, the width W1 may be substantially equal to the width W2 and/or the width W3, but is not limited thereto. It should be noted that the aforementioned width W1, width W2, and width W3 respectively measure the maximum width of the layer (or device) in the X-axis direction, and the X-axis direction is substantially perpendicular to the top-view direction Z.

In some embodiments, a reflective layer 150 may be selectively disposed on the sidewall S1 of the light-emitting element 110. Since the light emitted by the light-emitting element 110 is emitted all-around, the reflective layer 150 may be disposed on the sidewall S1 of the light-emitting element 110 to reflect the light emitted from the sidewall S1 of the light-emitting element 110 to the light conversion layer 120. As such, the light conversion efficiency may be improved, or the probability of the unconverted color light emitted through the sidewall S1 of the light-emitting element 110 may be reduced, so as to reduce the influence on the color purity of the light emitted by the light-emitting unit. In some embodiments, the material of the reflective layer 150 may include metal, alloy or other non-metallic materials (such as white paint or white ink) with a reflective function, or a combination thereof, but is not limited thereto. In some embodiments, an insulating layer 116 is disposed between the sidewall S1 of the light-emitting element 110 and the reflective layer 150. In some embodiments, the insulating layer 116 may be disposed between the semiconductor layer 112 (and/or the semiconductor layer 114) and the reflective layer 150 to reduce the contact between the semiconductor layer 112 (and/or the semiconductor layer 114) and the reflective layer 150 to form a short circuit. Therefore, the probability of damage to the light-emitting element 110 may be reduced.

Figure 2:
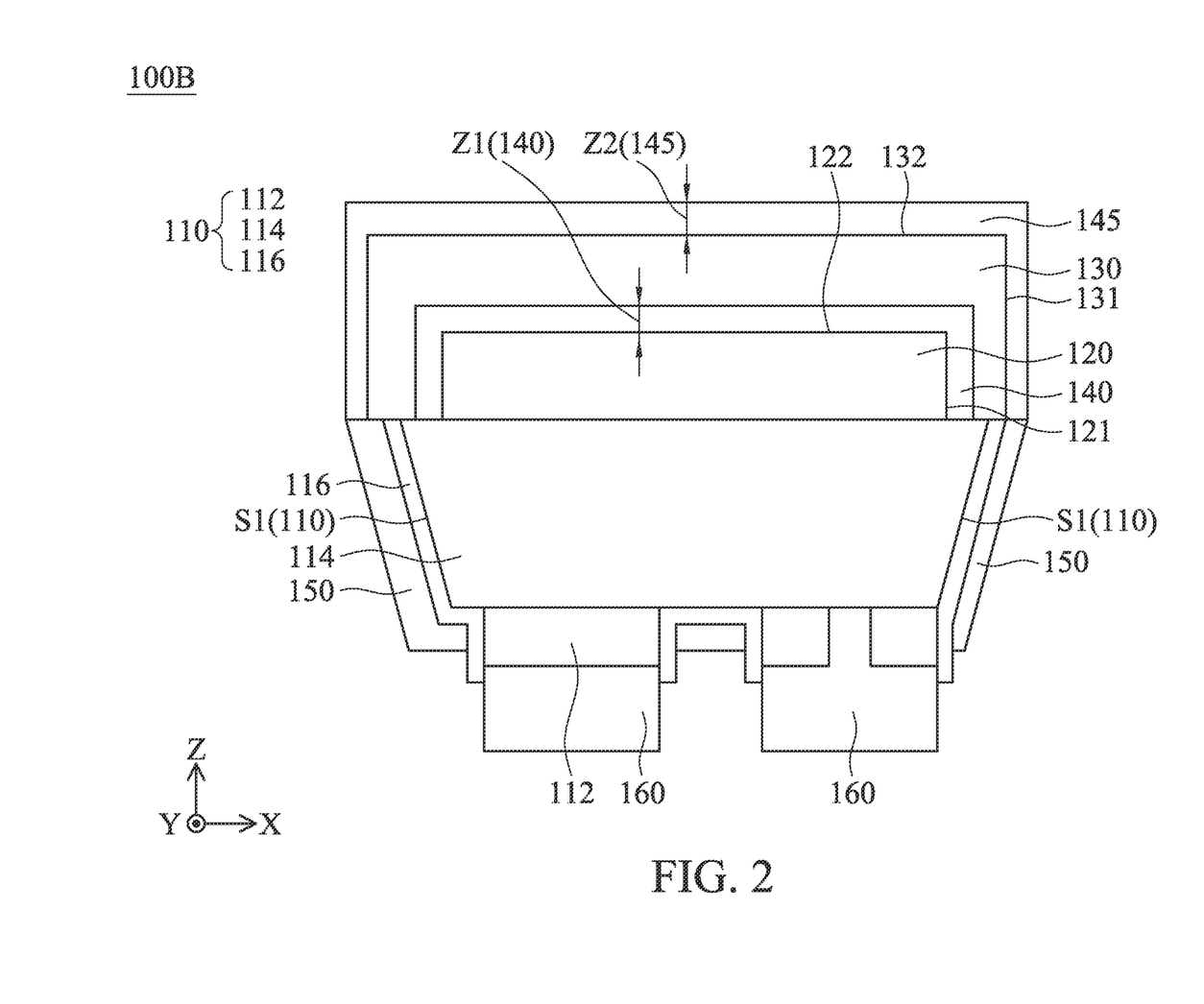
FIG. 2 is a cross-sectional view illustrating the light-emitting unit in accordance with some other embodiments of the present disclosure.

In some embodiments, the light-emitting unit 100A may include a plurality of conductive pads 160, and the light-emitting element 110 may be electrically connected to a driving circuit through the conductive pads 160 to transmit signals to control the operation of the light-emitting element 110. In some embodiments, the electronic device may have a plurality of light-emitting units 100A, and the configuration of the light-emitting element 110, the light conversion layer 120, and/or the color filter layer 130 in the light-emitting units 100A enables different light-emitting units 100A to emit lights of different colors. FIG. 2 is a cross-sectional view illustrating the light-emitting unit 100B in accordance with some other embodiments. It should be noted that the light-emitting unit 100B may include the same or similar portions as the light-emitting unit 100A shown in FIG. 1. These portions will be denoted by the same or similar reference numerals, and the description will not be repeated hereinafter. For example, the light-emitting unit 100B includes a light-emitting element 110, a light conversion layer 120, and a color filter layer 130. The difference between the light-emitting unit 100B and the light-emitting unit 100A shown in FIG. 1 is that the light-emitting unit 100B further includes a protective layer 140 located between the color filter layer 130 and the light conversion layer 120. For example, the protective layer 140 may cover the sidewall 121 of the light conversion layer 120 and the upper surface 122 of the light conversion layer 120. In some embodiments, the light-emitting unit 100B further includes a protective layer 145 located outside of the color filter layer 130 (for example, on the sidewall 131 and/or the upper surface 132). In some embodiments, the protective layer 140 and/or the protective layer 145 includes a transparent material, an insulating material, or a combination thereof. For example, the material of the protective layer 140 and/or the protective layer 145 includes silicon oxide, silicon nitride, any other suitable materials, or a combination thereof. The materials of the protective layer 140 and/or the protective layer 145 may be the same or different. The protective layer 140 and/or the protective layer 145 may include a single layer or a composite layer. The arrangement of the protective layer 140 may reduce the probability that the light conversion layer 120 is damaged or invaded by water and oxygen. In addition, the provision of the protective layer 145 may reduce the probability that the color filter layer 130 is damaged or invaded by water and oxygen. In some embodiments, the thickness Z1 of the protective layer 140 may be the same as or different from the thickness Z2 of the protective layer 145. For example, the thickness Z1 is measured as the maximum thickness of the protective layer 140 on the upper surface 122 of the light conversion layer 120 in the top-view direction Z, and the thickness Z2 is measured as the maximum thickness of the protective layer 145 on the upper surface 132 of the color filter layer 130. It should be understood that although the protective layer 140 and the protective layer 145 are both shown in the present embodiment, those skilled in the art may omit any one of the protective layer 140 and the protective layer 145 as required.

Figure 3:
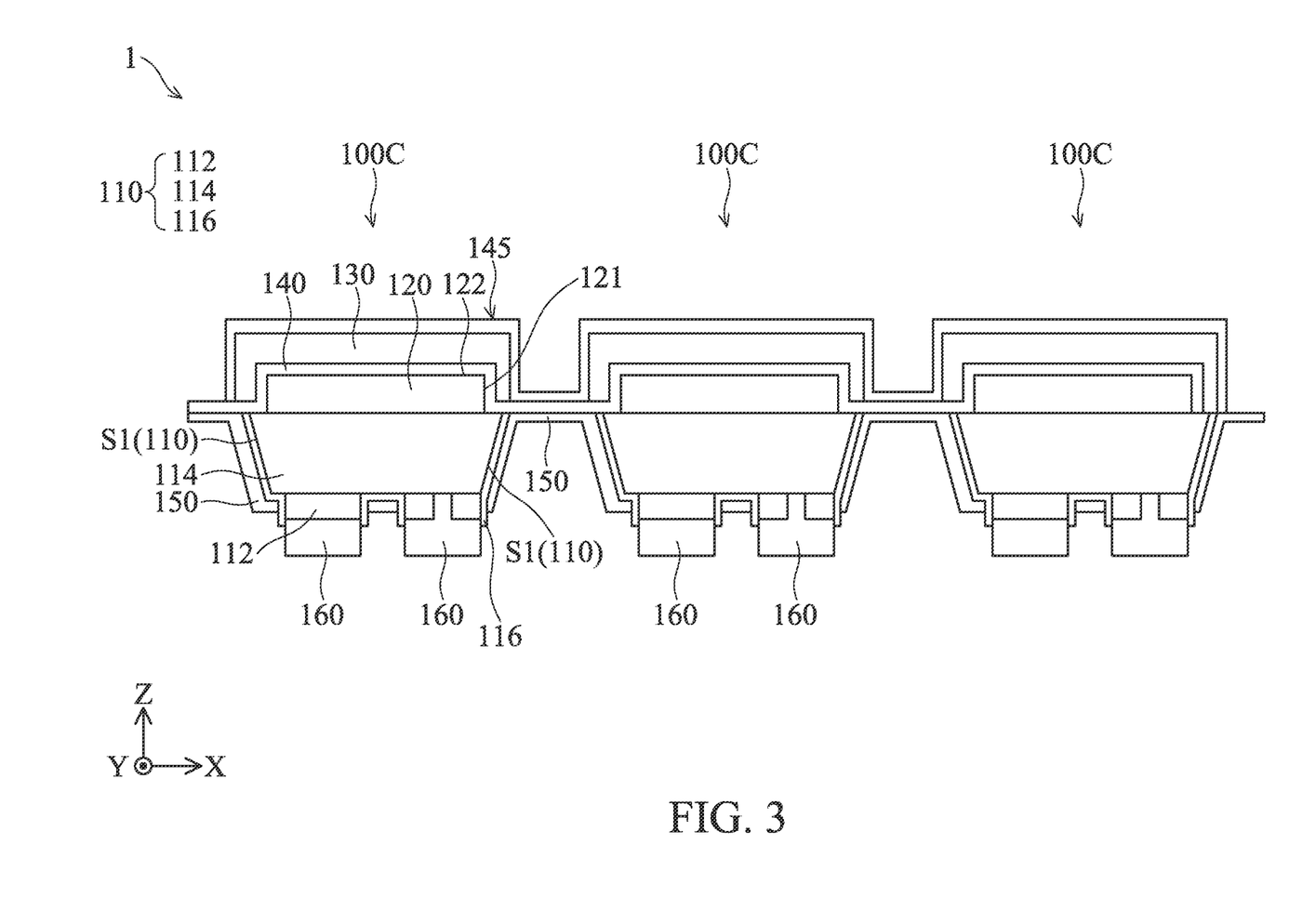
FIG. 3 is a cross-sectional view illustrating the light-emitting module in accordance with some other embodiments of the present disclosure.

FIG. 3 is a cross-sectional view illustrating a light-emitting module including a plurality of light-emitting units in accordance with some other embodiments of the present disclosure. It should be noted that the light-emitting units 100C shown in the present embodiment may include the same or similar portions as the light-emitting unit 100B shown in FIG. 2. These portions will be denoted by the same or similar reference numerals, and the description will not be repeated hereinafter. For example, a light-emitting module 1 includes the plurality of light-emitting units 100C, each of the plurality of light-emitting units 100C includes a light-emitting element 110 and a corresponding light conversion layer 120 and/or color filter layer 130. Each of these light-emitting units 100C may include a protective layer 140, a protective layer 145 and/or a reflective layer 150, but are not limited thereto. In some embodiments, the protective layers 140 of adjacent two of the light-emitting units 100C may connect to each other, the protective layers 145 of adjacent two of the light-emitting units 100C may connect to each other, and/or the reflective layers 150 of adjacent two of the light-emitting units 100C may connect to each other, but it is not limited thereto. In other words, the protective layer 140, the protective layer 145 and/or the reflective layer 150 of the light-emitting units 100C may continuously extend onto different light-emitting elements 110, but it is not limited thereto. The above design may simplify the production of the protective layer 140, the protective layer 145 and/or the reflective layer 150. In other embodiments (not shown), the protective layers 140 of the light-emitting units 100C may be separated from each other, the protective layers 145 of the light-emitting units 100C may be separated from each other, and/or the reflective layers 150 of the light-emitting units 100C may be separated from each other, but it is not limited thereto. In other embodiments (not shown), the protective layers 140, the protective layers 145 and/or the reflective layers 150 of the light-emitting units 100C may be partially separated and partially connected.

Figure 4:
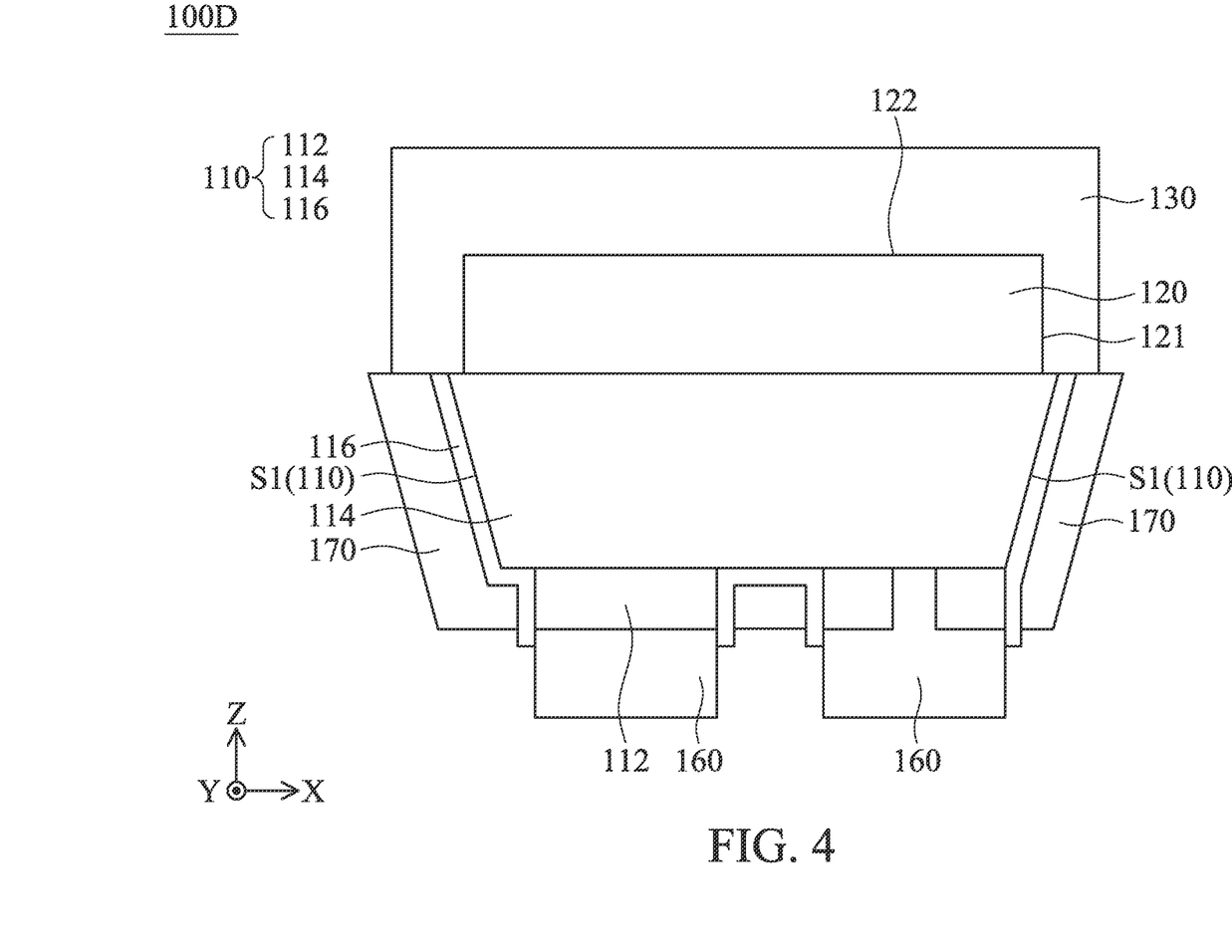
FIG. 4 is a cross-sectional view illustrating the light-emitting unit in accordance with some other embodiments of the present disclosure.

FIG. 4 is a cross-sectional view illustrating the light-emitting unit 100D in accordance with some other embodiments of the present disclosure. It should be noted that the light-emitting unit 100D shown in the present embodiment may include the same or similar portions as the light-emitting unit 100A shown in FIG. 1. These portions will be denoted by the same or similar reference numerals, and the description will not be repeated hereinafter. For example, the light-emitting unit 100D includes a light-emitting element 110, a light conversion layer 120, and a color filter layer 130. The difference between the light-emitting unit 100D and the light-emitting unit 100A shown in FIG. 1 is that the reflective layer 150 disposed on the sidewall S1 of the light-emitting element 110 is replaced with a light-shielding layer 170, but it is not limited thereto. In other words, the light-emitting unit 100D further includes a light-shielding layer 170 covering the sidewall S1 of the light-emitting element 110. For example, the light shielding layer 170 may include black ink, black paint, black photoresist, other light shielding materials, or a combination thereof, but it is not limited thereto. With the provision of the light shielding layer 170, the cross-talk issue between different light-emitting elements 110 may be reduced.

Figure 5:
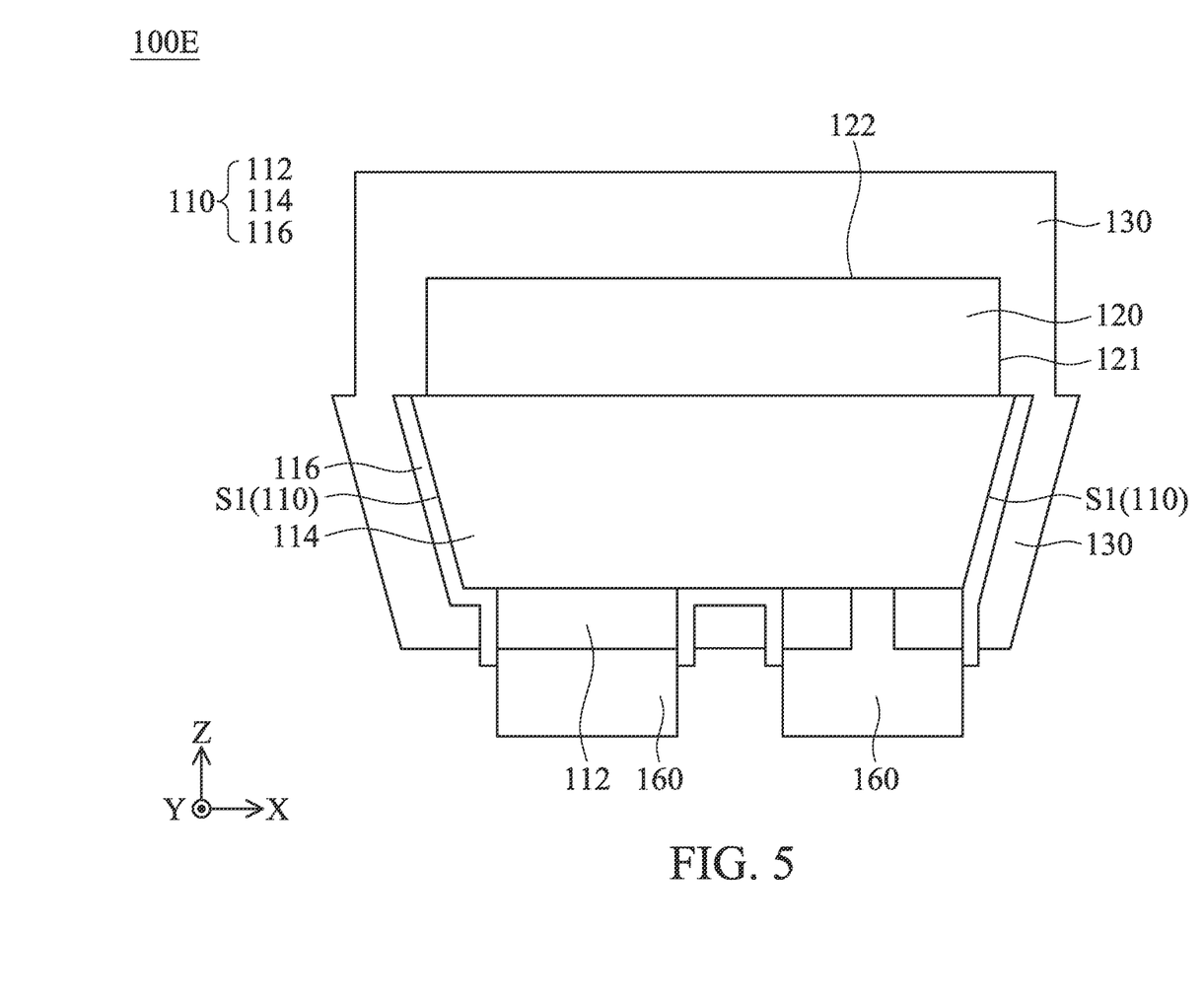
FIG. 5 is a cross-sectional view illustrating the light-emitting unit in accordance with some other embodiments of the present disclosure.

FIG. 5 is a cross-sectional view illustrating the light-emitting unit 100E in accordance with some other embodiments of the present disclosure. It should be noted that the light-emitting unit 100E shown in the present embodiment may include the same or similar portions as the light-emitting unit 100A shown in FIG. 1. These portions will be denoted by the same or similar reference numerals, and the description will not be repeated hereinafter. For example, the light-emitting unit 100E includes a light-emitting element 110, a light conversion layer 120, and a color filter layer 130. The difference between light-emitting unit 100E and the light-emitting unit 100A shown in FIG. 1 is that the color filter layer 130 of the light-emitting unit 100E may be disposed on the sidewall S1 of the light-emitting element 110, the color filter layer 130 may cover the sidewall S1 of the light-emitting element 110. In other words, in the light-emitting unit 100E, the reflective layer 150 of the light-emitting unit 100A is replaced with the color filter layer 130. In some embodiments, the color filter layer 130 on the light conversion layer 120 and the color filter layer 130 on the sidewall S1 of the light-emitting element 110 may be selectively formed by the same or different process steps. In some embodiments, the color filter layer 130 on the light conversion layer 120 and the color filter layer 130 on the sidewall S1 of the light-emitting element 110 may be selectively formed by the same or different materials. The arrangement of the color filter layer 130 on the sidewall S1 of the light-emitting element 110 may reduce the probability of emitting the unconverted colored light (such as blue light) emitted through the sidewall S1 of the light-emitting element 110, or improving the color purity of the light-emitting element 110.

Figure 6:
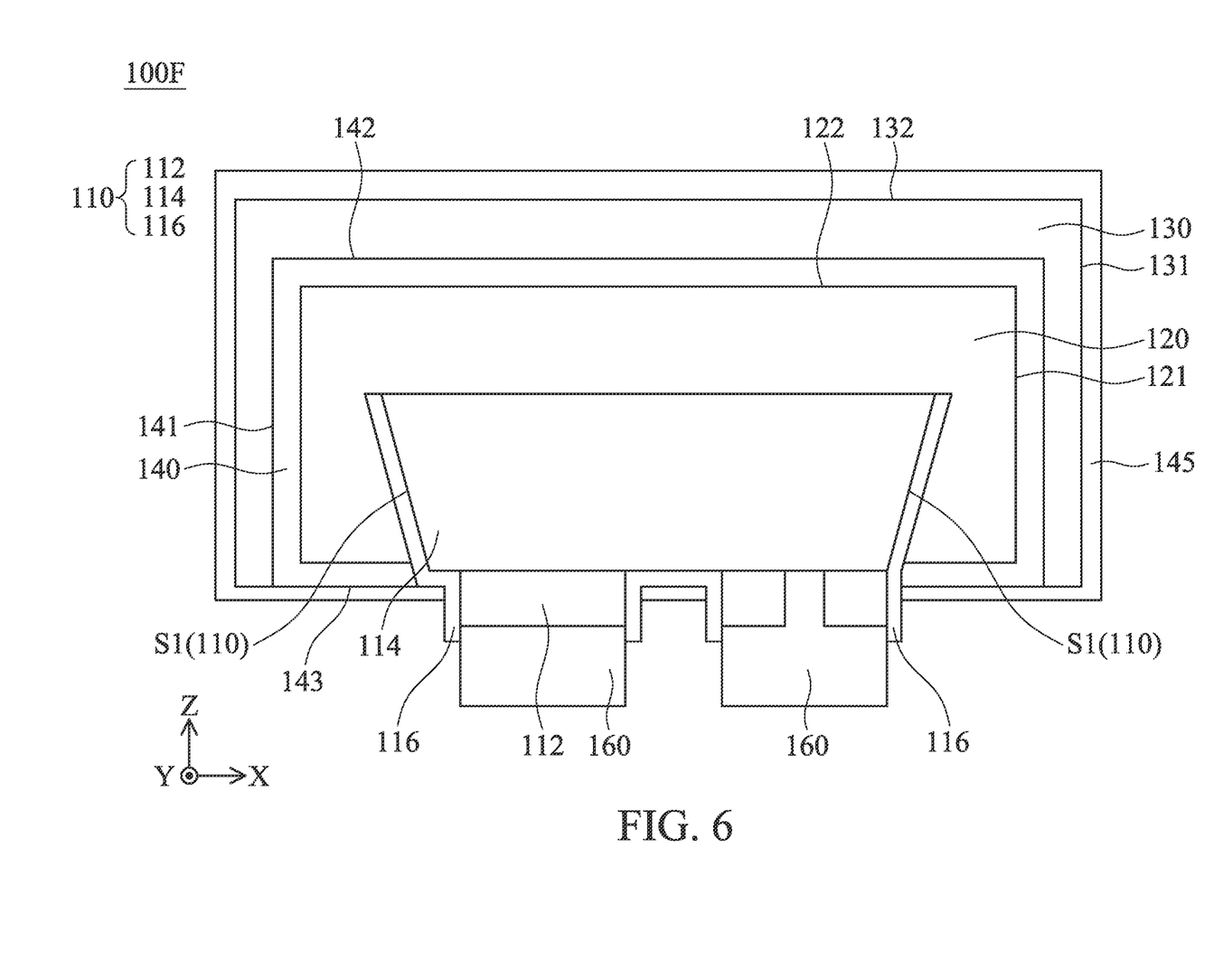
FIG. 6 is a cross-sectional view illustrating the light-emitting unit in accordance with some other embodiments of the present disclosure.

FIG. 6 is a cross-sectional view illustrating the light-emitting unit 100F in accordance with some other embodiments. It should be noted that the light-emitting unit 100F shown in the present embodiment may include the same or similar portions as the light-emitting unit 100B shown in FIG. 2. These portions will be denoted by the same or similar reference numerals, and the description will not be repeated hereinafter. For example, the light-emitting unit 100F includes a light-emitting element 110, a light conversion layer 120, a color filter layer 130, a protective layer 140 and a protective layer 145. In some embodiments, the light conversion layer 120 (and/or the color filter layer 130) covers the sidewall S1 of the light-emitting element 110. In the present embodiment, the light conversion layer 120, the color filter layer 130, the protective layer 140, and/or the protective layer 145 may selectively extend to or cover the sidewall S1 of the light-emitting element 110. In some embodiments (not shown), the protective layer 140 and/or the protective layer 145 may have curved edges. For example (not shown), the corners of the upper surface 142 and/or the sidewalls 141 of the protective layer 140 may have curved edges, but the present disclosure is not limited thereto. Alternatively, the corners of the bottom surface 143 and/or the sidewalls 141 of the protective layer 140 may have curved edges, but it is not limited thereto. In other embodiments (not shown), the corners of the upper surface (not labeled) and/or sidewalls (not labeled) of the protective layer 145 may have curved edges. Alternatively, the corners of the bottom surface (not labeled) and/or sidewalls (not labeled) of the protective layer 145 may have curved edges. In other embodiments, those skilled in the art may omit any one of the protective layer 140 and the protective layer 145 as required. In some embodiments, the protective layer 140 may be in contact with or non-contact with the protective layer 145. In some embodiments, the protective layer 140 and/or the protective layer 145 may be in contact with or non-contact with the insulating layer 116, for example.

Figure 7:
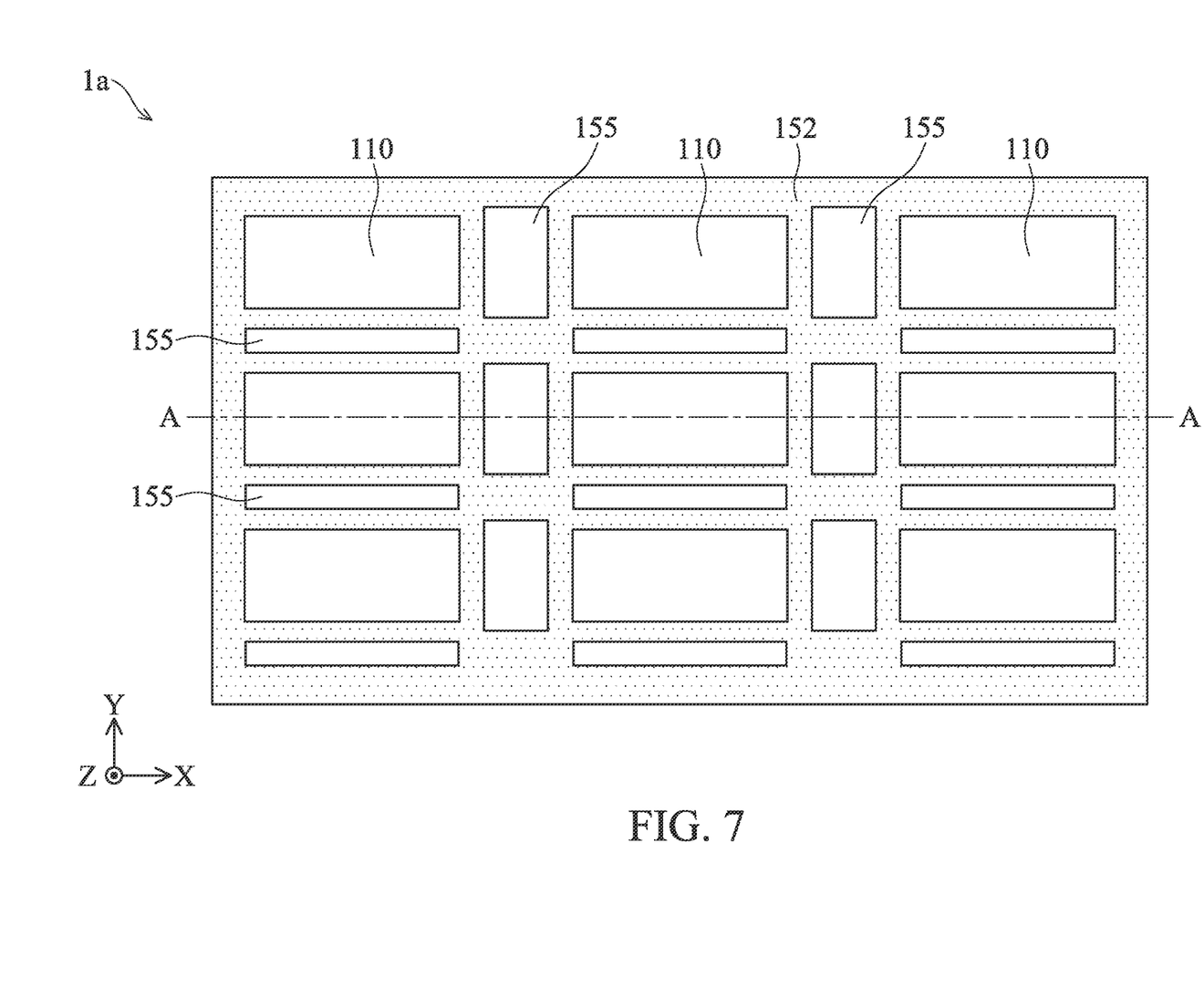
FIG. 7 is a top view illustrating the light-emitting module in accordance with some other embodiments of the present disclosure.
Figure 8:
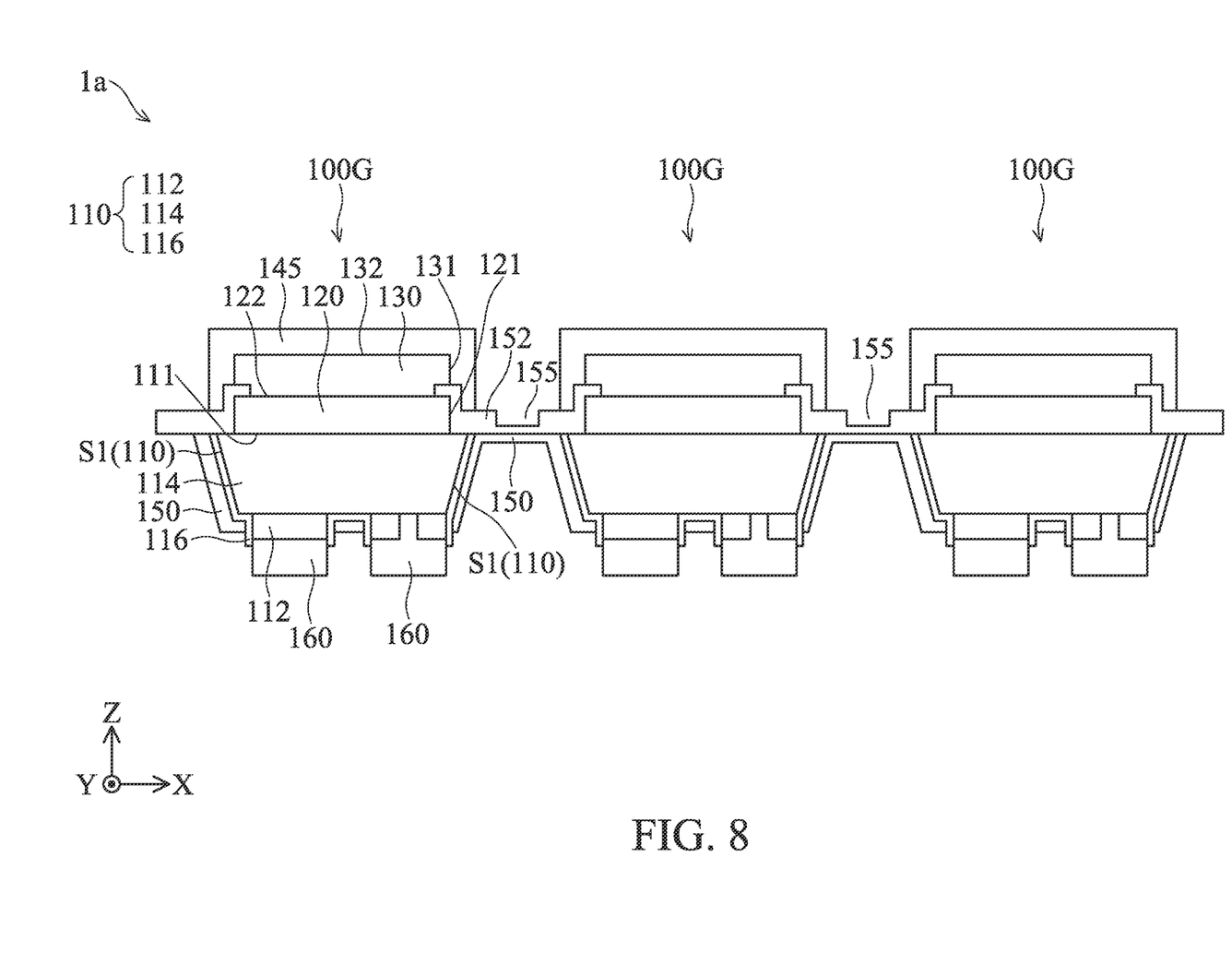
FIG. 8 is a cross-sectional view illustrating along line A-A shown in FIG. 7.

FIG. 7 is a top view illustrating a light-emitting module including a plurality of light-emitting units in accordance with some other embodiments of the present disclosure. FIG. 8 is a cross-sectional view illustrating along line A-A shown in FIG. 7. It should be noted that the light-emitting units 100G shown in the present embodiment may include the same or similar portions as the light-emitting unit 100B shown in FIG. 2. These portions will be denoted by the same or similar reference numerals, and the description will not be repeated hereinafter. For example, a light-emitting module 1a includes the light-emitting units 100G, each of the light-emitting units 100G includes a light-emitting element 110 and a corresponding light conversion layer 120 and/or color filter layer 130. In addition, the light-emitting unit 100G also includes a protective layer 145 and a reflective layer 150. As shown in FIG. 8, the light-emitting units 100G may further include a reflective layer 152, and the reflective layer 152 may be disposed on the light-emitting element 110. In some embodiments, the reflective layer 152 may selectively contact the upper surface 111 of the light-emitting element 110. In some embodiments, the reflective layer 152 may cover the sidewall 121 of the light conversion layer 120 and further extend to a portion of the upper surface 122 of the light conversion layer 120, but is not limited thereto. In some embodiments, the reflective layer 152 may contact the reflective layer 150. In some embodiments, in the top-view direction Z, the reflective layer 152 may partially overlap the light conversion layer 120. In some embodiments, a portion of the reflective layer 152 may be located between the light conversion layer 120 and the color filter layer 130. In some embodiments, the reflective layer 152 may be continuously or discontinuously disposed on different light-emitting elements 110. With the arrangement of the reflective layer 152, the light not converted by the light conversion layer 120 may be reflected to the light conversion layer 120, thereby improving the light conversion efficiency. In addition, the arrangement of the reflective layer 152 may position different light-emitting elements 110 during the manufacturing process, reducing the probability of the light-emitting elements 110 shifting. In some embodiments, the protective layer 145 may be disposed on the color filter layer 130 and/or the reflective layer 152. In some embodiments, the protective layer 145 may extend to the sidewall 131 of the color filter layer 130 and/or a portion of the reflective layer 152.

Referring to FIGS. 7 and 8, in some embodiments, the light-emitting units 100G further includes a reflective layer 152, and the reflective layer 152 may surround the sidewall 121 of the light conversion layer 120 (as shown in FIG. 8). In some embodiments, the reflective layer 152 of the light-emitting units 100G may form a reflective layer having a notch 155, and the notch 155 may be a thinner area of the layer. In some embodiments, as shown in FIG. 7, in the top-view direction Z, the notch 155 may be located between two adjacent light-emitting elements 110, but it is not limited thereto. In some embodiments, as shown in FIG. 7, in the top-view direction Z, the shapes of the different notches 155 may be the same or different. In some embodiments, by forming the notch 155 on the reflective layer 152, different light-emitting units 100G (and/or 110 light-emitting elements 110) may be separated in subsequent process. In some embodiments, in the top-view direction Z, the layer, which be formed by the reflective layer 152 of the light-emitting units 100G may be in a grid shape, but it is not limited thereto. In other embodiments (not shown), the notch 155 in FIG. 7 may be replaced with an opening (penetrating through the reflective layer 152), which facilitates the subsequent separation of different light-emitting units 100G (and/or 110 light-emitting elements 110), but it is not limited thereto.

Figure 9:
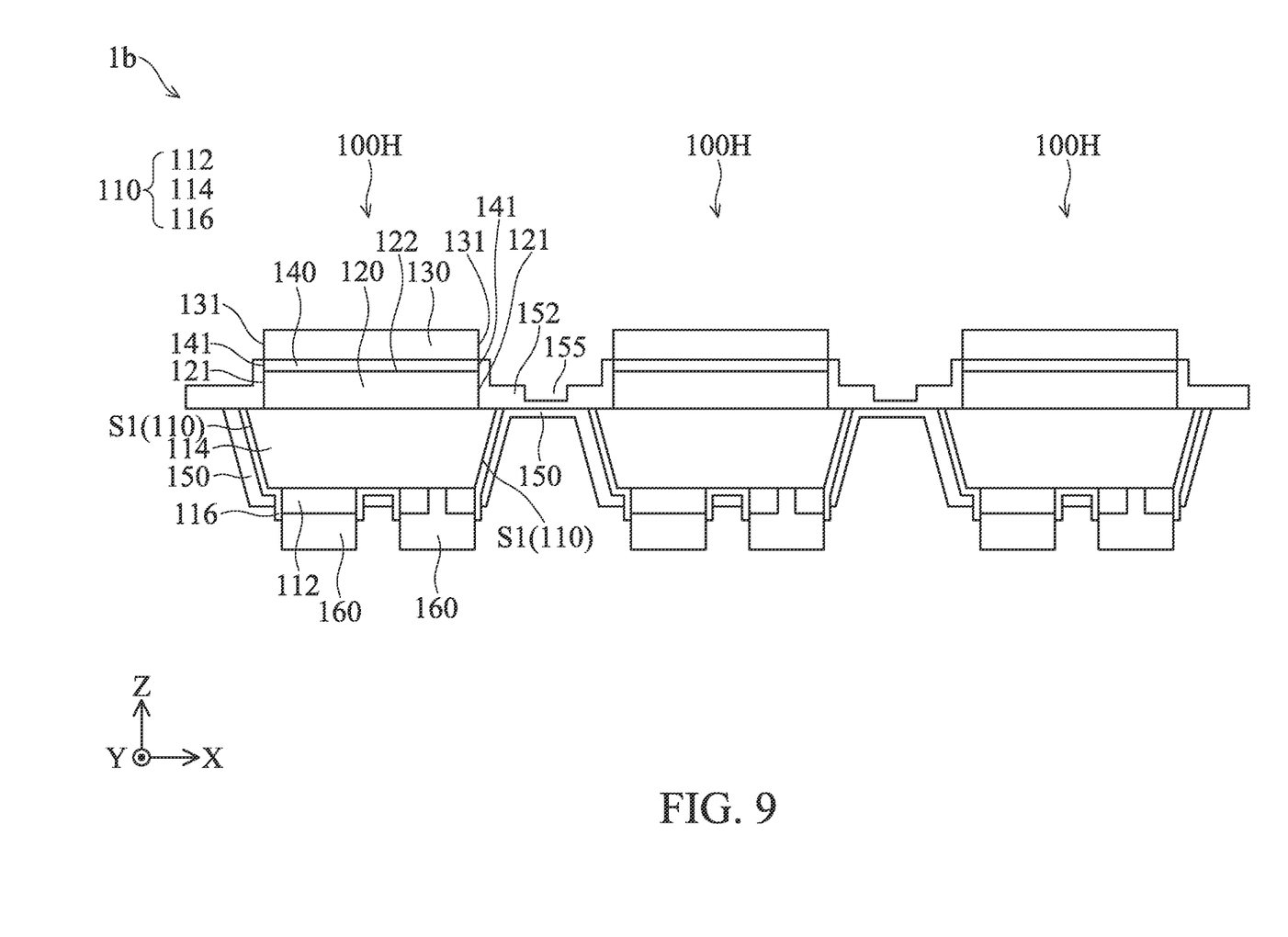
FIG. 9 is a cross-sectional view illustrating the light-emitting module in accordance with some other embodiments of the present disclosure.

FIG. 9 is a cross-sectional view illustrating a light-emitting module including a plurality of light-emitting units in accordance with some other embodiments of the present disclosure. It should be noted that the light-emitting units 100H shown in the present embodiment may include the same or similar portions as the light-emitting units 100G shown in FIG. 8. These portions will be denoted by the same or similar reference numerals, and the description will not be repeated hereinafter. For example, a light-emitting module 1b includes the light-emitting units 100H, each of the light-emitting units 100H includes a light-emitting element 110 and a corresponding light conversion layer 120, a color filter layer 130. In addition, the light-emitting unit 100H includes a reflective layer 150 and a reflective layer 152. In some embodiments, the protective layer 140 may be disposed or located between the light conversion layer 120 and the color filter layer 130. In some embodiments, the sidewalls 141 of the protective layer 140, the sidewalls 121 of the light conversion layer 120, and/or the sidewalls 131 of the color filter layer 130 may be substantially aligned, but are not limited thereto. In some embodiments, in the top-view direction Z, the areas of the protective layer 140, the light conversion layer 120 and/or the color filter layer 130 may be optionally the same or different, but that are not limited thereto. In some embodiments, in the X-axis direction, the width of the protective layer 140, the width of the light conversion layer 120 (not shown, referring to the width W2 in FIG. 1), and/or the width of the color filter layer 130 (not shown, referring to the width W3 in FIG. 1) may be optional to be the same or different, but they are not limited thereto. The above-mentioned widths are the maximum width of the layer in the X-axis direction. In some embodiments, the top of the protective layer 140 and the top of the reflective layer 152 may be substantially aligned, but the present disclosure is not limited thereto. In some embodiments (not shown), the top portion of the protective layer 140 may protrude from the top portion of the reflective layer 152.

Figure 10:
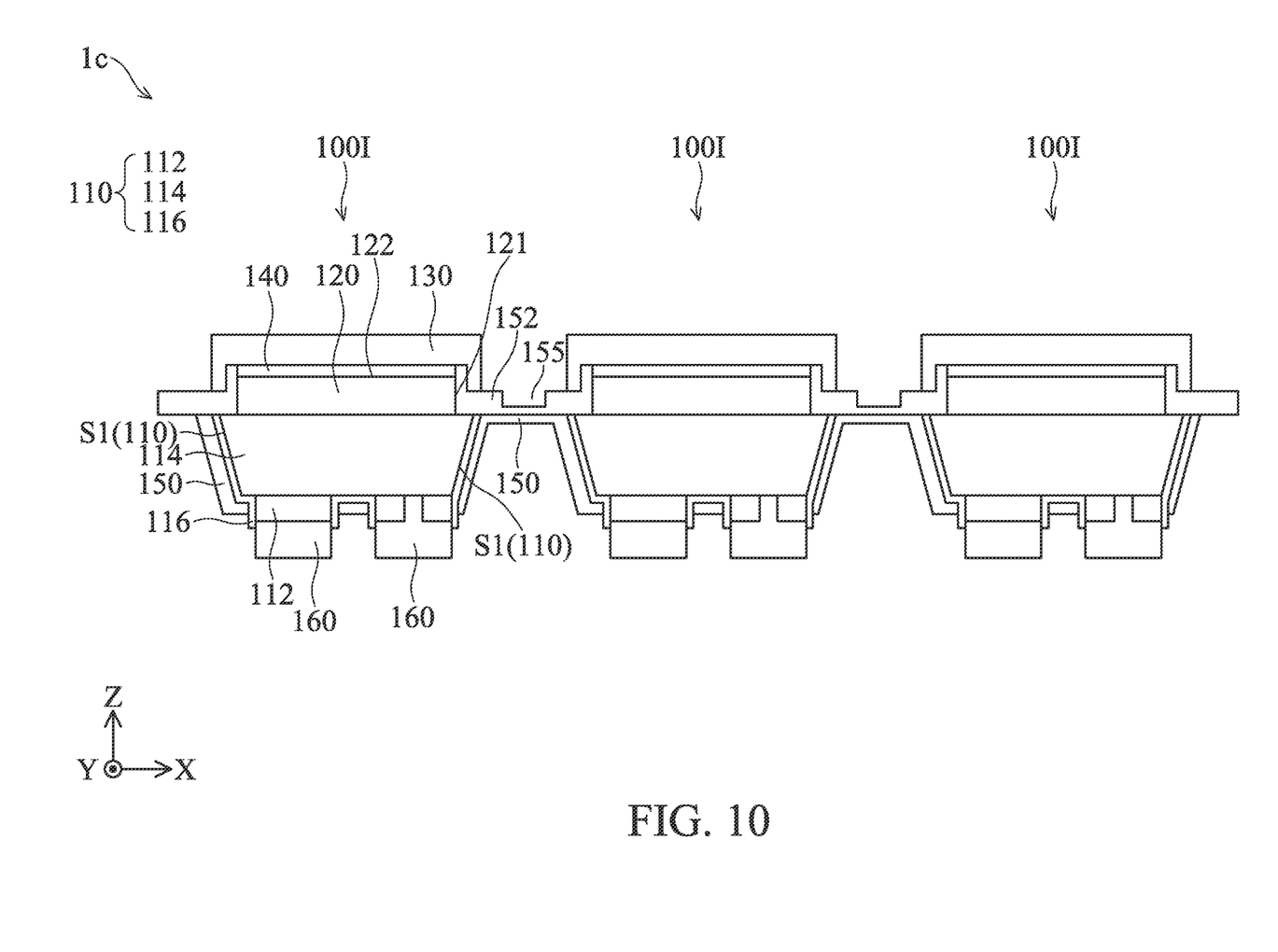
FIG. 10 is a cross-sectional view illustrating the light-emitting module in accordance with some other embodiments of the present disclosure.

FIG. 10 is a cross-sectional view illustrating a light-emitting module including a plurality of light-emitting units in accordance with some other embodiments of the present disclosure. It should be noted that the light-emitting units 100I shown in the present embodiment may include the same or similar portions as the light-emitting units 100H shown in FIG. 9. These portions will be denoted by the same or similar reference numerals, and the description will not be repeated hereinafter. For example, a light-emitting module 1c includes the light-emitting units 100I, each of the light-emitting units 100I includes a light-emitting element 110, a corresponding light conversion layer 120, and a color filter layer 130. In addition, each of the light-emitting units 100I includes a protective layer 140, a reflective layer 150 and/or a reflective layer 152. In the present embodiment, the color filter layer 130 may extend onto a portion of the reflective layer 152. In some embodiments, the color filter layer 130 and the reflective layer 152 may at least partially overlap in the top-view direction Z.

Figure 11:
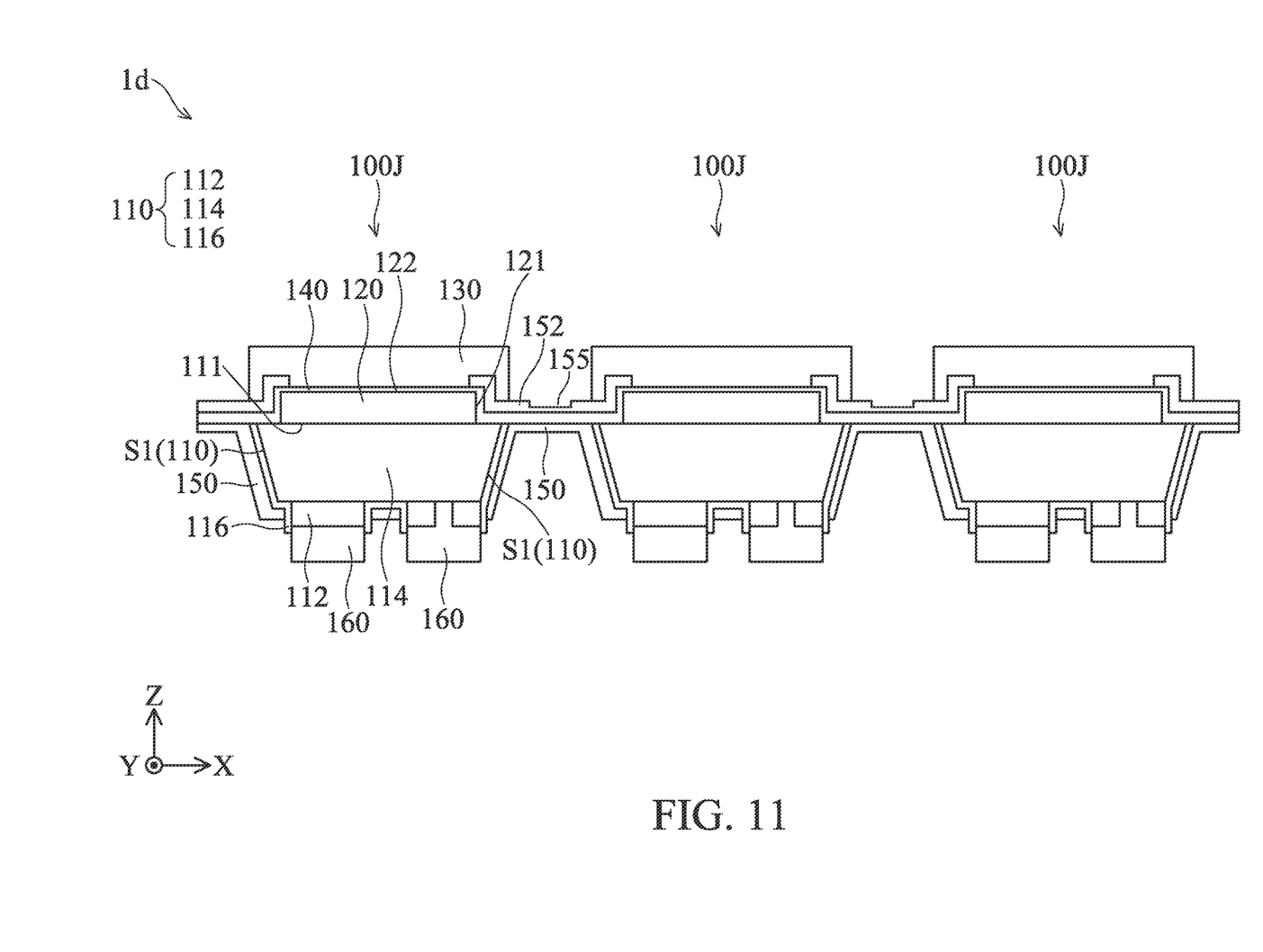
FIG. 11 is a top view illustrating the light-emitting module in accordance with some other embodiments of the present disclosure.

FIG. 11 is a top view illustrating a light-emitting module including a plurality of light-emitting units in accordance with some other embodiments of the present disclosure. It should be noted that the light-emitting units 100J shown in the present embodiment may include the same or similar portions as the light-emitting units 100H shown in FIG. 9. These portions will be denoted by the same or similar reference numerals, and the description will not be repeated hereinafter. For example, a light-emitting module 1d includes the light-emitting units 100J, each of the light-emitting units 100J includes a light-emitting element 110, a corresponding light conversion layer 120 and a color filter layer 130. In addition, the light-emitting unit 100J includes a protective layer 140, a reflective layer 150 and/or a reflective layer 152. In some embodiments, the protective layer 140 is disposed on the light conversion layer 120 and is located between the light conversion layer 120 and the color filter layer 130. As shown in FIG. 11, the protective layer 140 may continuously extend onto different light-emitting elements 110, but is not limited thereto. In some embodiments, the reflective layer 152 is disposed on the protective layer 140, and the color filter layer 130 is disposed on the reflective layer 152 and the protective layer 140. In some embodiments, the protective layer 140 may be located between the reflective layer 152 and the reflective layer 150. In some embodiments, the protective layer 140 may contact a portion of the light-emitting element 110, and the protective layer 140 may be continuously disposed on different light-emitting elements 110.

As set forth above, the embodiments of the present disclosure provide a light-emitting unit provided with a color filter layer that covers the sidewall of the light conversion layer. In this way, the color purity of the light emitted by the light-emitting unit is improved to enhance the display quality. In addition, the light-emitting unit may have a protective layer, which may reduce the probability of water and oxygen intruding into the light-emitting unit, and improve the reliability or efficiency of the light-emitting unit. In addition, a reflective layer, a light-shielding layer and/or a color filter layer may be arranged on the sidewall of the light-emitting element, which may improve the color purity of the light emitted by the light-emitting unit.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A light-emitting unit, comprising:
    a light-emitting element;
    a light conversion layer disposed on the light-emitting element;
    a color filter layer covering a sidewall of the light conversion layer; and
    a first reflective layer disposed on a sidewall of the light-emitting element
    a second reflective layer, wherein the second reflective layer covers the sidewall of the light conversion layer and extends to a portion of an upper surface of the light conversion layer.

2. The light-emitting unit as claimed in claim 1, further comprising a protective layer located between the color filter layer and the light conversion layer.

3. The light-emitting unit as claimed in claim 2, wherein the protective layer covers the sidewall of the light conversion layer and an upper surface of the light conversion layer.

4. The light-emitting unit as claimed in claim 2, wherein a sidewall of the protective layer, the sidewall of the light conversion layer, and a sidewall of the color filter layer are aligned.

5. The light-emitting unit as claimed in claim 2, wherein the protective layer contacts a portion of the light-emitting element.

6. The light-emitting unit as claimed in claim 1, wherein the light conversion layer covers a sidewall of the light-emitting element.

7. The light-emitting unit as claimed in claim 1, further comprising a protective layer located outside of the color filter layer.

8. The light-emitting unit as claimed in claim 1, further comprising an insulating layer disposed between the sidewall of the light-emitting element and the first reflective layer.

9. The light-emitting unit as claimed in claim 1, wherein the second reflective layer contacts the first reflective layer.

10. The light-emitting unit as claimed in claim 1, wherein a portion of the second reflective layer is located between the light conversion layer and the color filter layer.

11. The light-emitting unit as claimed in claim 1, wherein the color filter layer covers a sidewall of the light-emitting element.

12. The light-emitting unit as claimed in claim 1, further comprising a light-shielding layer covering a sidewall of the light-emitting element.

13. The light-emitting unit as claimed in claim 1, wherein the second reflective layer surrounds the sidewall of the light conversion layer.

14. The light-emitting unit as claimed in claim 1, wherein a width of the light-emitting element is greater than a width of the light conversion layer.

15. The light-emitting unit as claimed in claim 1, wherein a width of the color filter layer is greater than a width of the light conversion layer.

16. The light-emitting unit as claimed in claim 1, further comprising
    another reflective layer disposed on the light-emitting element and contacting an upper surface of the light-emitting element.

17. A light-emitting module, comprising:
    a plurality of light-emitting units, each of the plurality of light-emitting units comprising:
    a light-emitting element;
    a light conversion layer, disposed on the light-emitting element;
    a color filter layer covering a sidewall of the light conversion layer; and
    a reflective layer disposed on the light-emitting element and contacting an upper surface of the light-emitting element,
    wherein the reflective layer covers the sidewall of the light conversion layer and extends to a portion of an upper surface of the light conversion layerr.

18. The light-emitting module as claimed in claim 17, wherein each of the plurality of light-emitting units further comprises a protective layer located between the color filter layer and the light conversion layer.

* * * * *